United States Patent
Hatano et al.

(10) Patent No.: US 6,909,191 B2
(45) Date of Patent: Jun. 21, 2005

(54) SEMICONDUCTOR DEVICE

(75) Inventors: Masaaki Hatano, Yokohama (JP); Takamasa Usui, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/816,177

(22) Filed: Mar. 26, 2001

(65) Prior Publication Data

US 2001/0023988 A1 Sep. 27, 2001

(30) Foreign Application Priority Data

Mar. 27, 2000 (JP) ........................................ 2000-086383

(51) Int. Cl.⁷ .......................... H01L 29/40; H01L 21/94
(52) U.S. Cl. ...................... 257/761; 257/779; 257/781; 257/765; 438/612; 438/613
(58) Field of Search .............................. 257/779, 781, 257/459, 723, 761, 724, 765, 774, 773, 698, 697, 734, 740, 751, 763, 764, 768, 211, 767, 383, 750; 438/612, 613, 628, 627, 637, 653, 654, 629

(56) References Cited

U.S. PATENT DOCUMENTS

| | | | | |
|---|---|---|---|---|
| 4,498,121 A | * | 2/1985 | Breedis | 361/401 |
| 5,455,195 A | * | 10/1995 | Ramsey et al. | 437/183 |
| 5,658,828 A | | 8/1997 | Lin et al. | |
| 5,783,868 A | * | 7/1998 | Galloway | 257/784 |
| 5,897,369 A | | 4/1999 | Jun | |
| 5,918,149 A | | 6/1999 | Besser et al. | |
| 6,057,237 A | * | 5/2000 | Ding et al. | 438/687 |
| 6,124,203 A | * | 9/2000 | Joo et al. | 438/653 |
| 6,133,136 A | * | 10/2000 | Edelstein et al. | 438/618 |
| 6,150,272 A | * | 11/2000 | Liu et al. | 438/692 |
| 6,187,680 B1 | * | 2/2001 | Costrini et al. | 438/688 |
| 6,191,023 B1 | * | 2/2001 | Chen | 438/612 |
| 6,229,221 B1 | * | 5/2001 | Kloen et al. | 257/784 |
| 6,258,710 B1 | * | 7/2001 | Rathore et al. | |
| 6,312,830 B1 | * | 11/2001 | Li et al. | 428/624 |
| 6,320,263 B1 | * | 11/2001 | Lopatin et al. | 257/758 |
| 6,346,745 B1 | * | 2/2002 | Nogami et al. | 257/751 |
| 6,350,667 B1 | * | 2/2002 | Chen et al. | 438/612 |
| 6,359,328 B1 | * | 3/2002 | Dubin | 257/622 |
| 6,376,353 B1 | * | 4/2002 | Zhou et al. | 438/612 |
| 6,560,862 B1 | * | 5/2003 | Chen | 29/843 |
| 6,569,752 B1 | * | 5/2003 | Homma et al. | 438/597 |
| 2001/0009804 A1 | * | 7/2001 | Maekawa | 438/637 |
| 2001/0036716 A1 | * | 11/2001 | Chittipeddi et al. | 438/584 |
| 2002/0005582 A1 | * | 1/2002 | Nogami et al. | 257/758 |
| 2002/0046874 A1 | * | 4/2002 | Cabral et al. | 174/137 R |
| 2002/0053746 A1 | * | 5/2002 | Stamper et al. | 257/781 |

FOREIGN PATENT DOCUMENTS

| | | | |
|---|---|---|---|
| JP | 63-128648 | * | 1/1988 |
| JP | 8-17913 | | 1/1996 |
| JP | 8-124925 | | 5/1996 |
| JP | 10-313054 | | 11/1998 |
| JP | 11-111842 | | 4/1999 |
| JP | 11-121615 | | 4/1999 |
| JP | 11-135630 | | 5/1999 |
| JP | 2001015516 | * | 1/2001 |
| KR | 1999-0040755 | | 6/1999 |

* cited by examiner

*Primary Examiner*—Craig A. Thompson
*Assistant Examiner*—James M. Mitchell
(74) *Attorney, Agent, or Firm*—Finnegan, Henderson, Farabow, Garrett & Dunner, L.L.P.

(57) ABSTRACT

There is provided a semiconductor device comprising a Cu film provided above a main surface of a semiconductor substrate and used as a wiring, an intermediate layer formed at least on the Cu film, and an Al film formed on the intermediate layer and used as a pad, wherein the intermediate layer comprises a refractory metal nitride film and a refractory metal film formed on the refractory metal nitride film.

10 Claims, 7 Drawing Sheets

SEMICONDUCTOR DEVICE

CROSS-REFERENCE TO RELATED APPLICATIONS

This application is based upon and claims the benefit of priority from the prior Japanese Patent Application No. 2000-086383, filed Mar. 27, 2000, the entire contents of which are incorporated herein by reference.

BACKGROUND OF THE INVENTION

The present invention relates to a semiconductor device represented by an LSI, and more particularly to a connection between a Cu film for wiring and an Al film for a pad.

FIG. 10 is a sectional view showing a structure of a conventional semiconductor device having the Cu film for wiring and the Al film for the pad.

In an example shown in FIG. 10 there is shown a state in which a second layer region (comprising an interlayer insulating film 21, a barrier layer 22 and a Cu film 23 for wiring) is formed on a first layer region (an interlayer insulating film 11, a barrier layer 12 and a metal film 13 for wiring), and a third layer region (a silicon nitride film 31, an upper layer insulating film 32, a barrier layer 33 and an Al film 34 for a pad) are formed on the second layer region.

As shown in FIG. 10, a barrier layer 33 is provided between the Cu film 23 for wiring and the Al film 34 for the pad. This barrier layer 33 is provided for preventing a mutual diffusion between the Cu film 23 and the Al film 34. For a barrier metal of the barrier layer 33, a refractory metal nitride such as TaN, NbN, TiN, WN, VN or the like is used.

However, in the prior art, there is a problem in that when the Al film 34 is formed by the sputtering method or the like, Al contained in the Al film 34 and the N contained in the barrier layer 33 are allowed to react with each other to form AlNx which is an insulator so that the resistance (particularly via resistance) is raised with AlNx. Furthermore, there is also a problem in that since adherence between the silicon oxide film used for the upper layer insulating film 32 and the refractory metal nitride film used for the barrier layer 33 is poor, oxide invades from a gap between the silicon oxide film and the refractory metal nitride film with the result that the Cu film 23 is oxidized.

In this manner, in order to prevent mutual diffusion between the Cu film for wiring and the Al film for the pad, a refractory metal nitride film is provided as a barrier layer between the Cu film and the Al film. However, there is a problem in that a resistance is raised because of AlNx formed with a reaction between Al and N. There is also a problem in that the Cu film is oxidized because of poor adherence between the upper layer insulating film and the barrier layer. Thus, this leads to the deterioration of characteristic and reliability of the semiconductor device.

BRIEF SUMMARY OF THE INVENTION

The present invention has been made in view of the conventional problem, and an object of the present invention is to provide a semiconductor device having a Cu film for wiring and an Al film for a pad, wherein characteristic and reliability thereof are improved.

According to a first aspect of the present invention, there is provided a semiconductor device which comprises a Cu film provided above a main surface of a semiconductor substrate and used as a wiring; an intermediate layer formed at least on the Cu film; and an Al film formed on the intermediate layer and used as a pad; wherein the intermediate layer comprises a refractory metal nitride film and a refractory metal film formed on the refractory metal nitride film.

According to the present invention, there is obtained a structure in which a refractory metal film is sandwiched between the Al film and the refractory metal nitride film. Consequently, the fact that Al contained in the Al film and N contained in the refractory metal nitride film are allowed to react with each other to form AlNx which is an insulator can be prevented. Thus, the problem in that the resistance is raised with AlNx can be prevented so that a semiconductor device with an excellent characteristic can be obtained.

According to a second aspect of the present invention, there is provided a semiconductor device which comprises a Cu film provided above a main surface of a semiconductor substrate and used as a wiring; an intermediate layer formed at least on the Cu film; and an Al film formed on the intermediate layer and used as a pad; wherein the intermediate layer comprises a refractory metal film and a refractory metal nitride film formed on the refractory metal film.

According to the present invention, since the refractory metal film having more excellent adherence to the insulating film (particularly, a silicon oxide based insulating film) than the refractory metal nitride film is formed under the refractory metal nitride film, adherence between the intermediate layer and the insulating film contacting the intermediate layer is improved. Consequently, it is possible to prevent the problem in that oxygen invades from a gap generated by adherence failure so that the Cu film is oxidized. Thus, it becomes possible to manufacture a semiconductor device having an excellent reliability.

According to the first and the second aspects of the invention, it is preferable that the refractory metal contained in the refractory metal film is the same as the refractory metal contained in the refractory metal nitride film. By using the same refractory metal in this manner, the same sputtering target can be used at the time of forming the refractory metal film and forming the refractory metal nitride film. Thus, the manufacturing step can be shortened and the manufacturing cost can be decreased.

According to the first and the second aspects of the present invention, it is preferable that the refractory metal film contains at least one metal selected from the group consisting of Ta (tantalum), Nb (niobium), Ti (titanium), w (tungsten) and V (vanadium), and the refractory metal nitride film contains at least one metal selected from the group consisting of Ta, Nb, Ti, W and V.

According to the first and the second aspects of the present invention, it is preferable that the thickness of the refractory metal film is 5 nm or less.

According to a third aspect of the present invention, there is provided a semiconductor device comprises a Cu film provided above a main surface of a semiconductor substrate and used as a wiring; an intermediate layer formed at least on the Cu film; and an Al film formed on the intermediate layer and used as a pad; wherein the intermediate layer comprises a first refractory metal film, a refractory metal nitride film formed on the first refractory metal film, and a second refractory metal film formed on the refractory metal nitride film.

According to the third aspect of the present invention, it is preferable that the refractory metal contained in the first refractory metal film, the refractory metal contained in the refractory metal nitride film and the refractory metal contained in the second refractory metal film are the same.

According to the third aspect of the present invention, it is preferable that the first refractory metal film contains at least one metal selected from the group consisting of Ta, Nb, Ti, W and V, the refractory metal nitride film contains at least one metal selected from the group consisting of Ta, Nb, Ti, W and V, and the second refractory metal film contains at least one metal selected from the group consisting of Ta, Nb, Ti, W and V.

According to the third aspect of the present invention, it is preferable that the thicknesses of the first refractory metal film and the second refractory metal film are 5 nm or less.

According the first, the second and the third aspects of the invention, the refractory metal nitride refers to metal nitride using a refractory metal element having a high melting point as a metal element. That is, the refractory metal nitride refers to a compound having a refractory metal and nitrogen as a main component.

According to the first, the second, and the third aspects of the present invention, it is preferable that the intermediate layer has a first portion which contacts the Cu film and a second portion which does not contact the Cu film, and an insulating film contacts the second portion.

According to the first, the second and the third aspects of the present invention, it is preferable that a boding wire is connected to the aluminum film which constitutes the pad layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
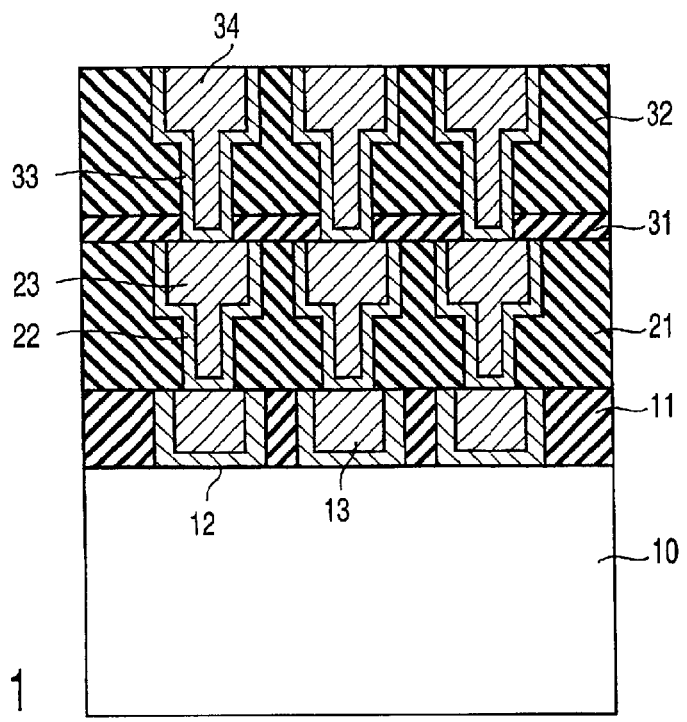
FIG. 1 is a sectional view showing a structure of a semiconductor device according to a first embodiment of the present invention.

Hereinafter, referring to the drawings, embodiments of the present invention will be explained.

(First Embodiment)

FIG. 1 is a sectional view showing a basic structure of a semiconductor device according to a first embodiment of the present invention.

In an embodiment shown in FIG. 1, there is shown a state in which a first layer region (comprising an interlayer insulating film 11, a barrier layer 12 and a metal film 13 for wiring) is formed on a semiconductor substrate 10, a second layer region (comprising an interlayer insulating region 21, a barrier layer 22 and a Cu film 23 for wiring) is formed on the first layer region, and a third layer region (comprising a silicon nitride film 31, an upper layer insulating film 32, a barrier layer 33 and an Al film 34 for a pad) is formed on the second layer region. Incidentally, a lower layer region may further exist between the semiconductor substrate 10 and the first layer region.

FIGS. 2A through 2G are sectional views showing a method for manufacturing the semiconductor device according to a first embodiment of the present invention. Incidentally, the semiconductor substrate 10 of FIG. 1 is not shown.

Figure 2A:
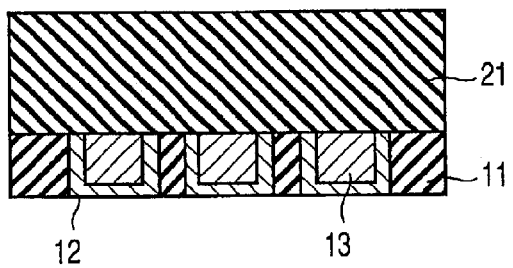
FIGS. 2A through 2G are sectional views showing a method for manufacturing a semiconductor device according to the first embodiment of the present invention.

In the beginning, as shown in FIG. 2A, on the main surface side of the semiconductor substrate (not shown) on which the semiconductor device (not shown) such as a transistor or the like is formed, the interlayer insulating film 11, the barrier layer 12 and the metal film 13 for wiring are formed as the first layer region. Furthermore, the interlayer insulating film 21 (for example, TEOS-SiO$_2$ film or the Low-k film (low dielectric constant film), or a lamination layer thereof) of the second layer region is formed thereon.

Figure 2B:
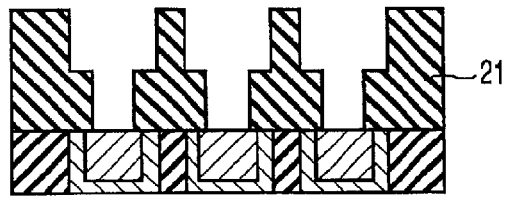

Next, as shown in FIG. 2B, the interlayer insulating film 21 is processed to form a via hole, and a groove for the wiring and the pad.

Figure 2C:
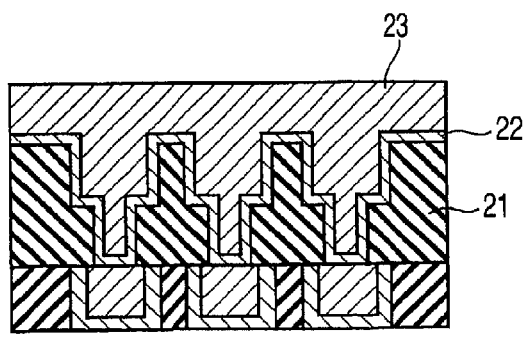

Next, as shown in FIG. 2C, as the barrier layer (barrier metal layer) 22, a refractory metal nitride film such as TaN, NbN or the like are formed on an overall surface. Furthermore, a Cu film 23 is formed on the barrier layer 22. The Cu film 23 is obtained by forming on the barrier layer 22 a Cu film which constitutes a seed layer and forming the Cu film by means of the electroplating process.

Figure 2D:
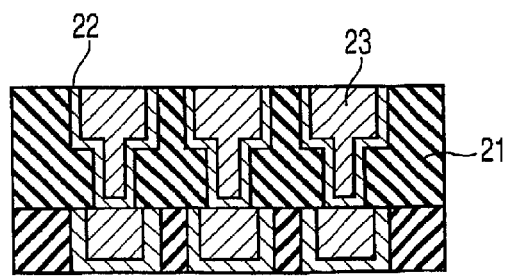

Next, as shown in FIG. 2D, a planarization processing is carried out with the CMP (chemical mechanical polishing) process so that a barrier layer 22 and the Cu film 23 are retained only inside the via hole, and the groove for the wiring and the pad. In this processing, the via, the wiring and the pad of the second layer region are formed.

After that, when the insulating film such as the TEOS-SiO$_2$ film or the Low-k film (a low dielectric constant film) or the like are formed as a passivation film, and the hole for the pad is formed in the insulating film, so that the surface of the Cu pad is exposed. As a consequence, the Cu pad portion is oxidized, and oxidation progresses with the lapse of time so that the Cu wiring as a whole is oxidized.

Then, in order to prevent the oxidation of the Cu pad, an Al pad region is formed as a third layer region. In this embodiment, a dual damascene process is used for the formation of the Al pad region shown in FIGS. 2E through 2G.

Figure 2E:
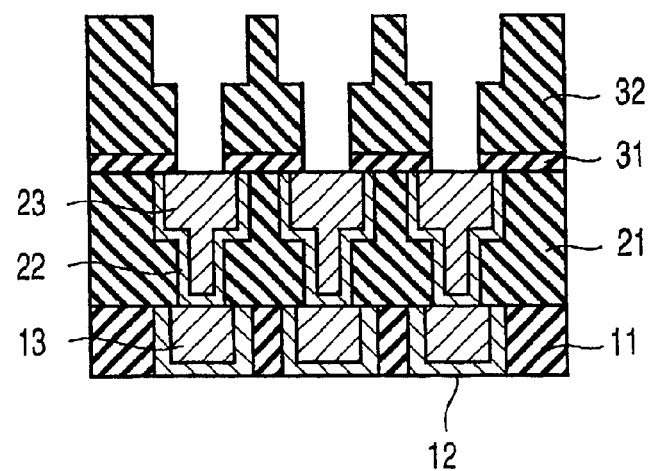

As shown in FIG. 2E, in order to prevent the diffusion of Cu contained in the Cu film 23, a silicon nitride film (plasma SiN film) 31 is formed on the overall surface. Subsequently, an upper layer insulating film 32 (for example, TEOS-SiO$_2$ film or a Low-k (low dielectric constant) film, or a lamination layer film thereof) are formed on the silicon nitride film 31. After that, the silicon nitride film 31 and the upper layer insulating film 32 are processed to form a via hole and a groove for the pad.

Figure 2F:
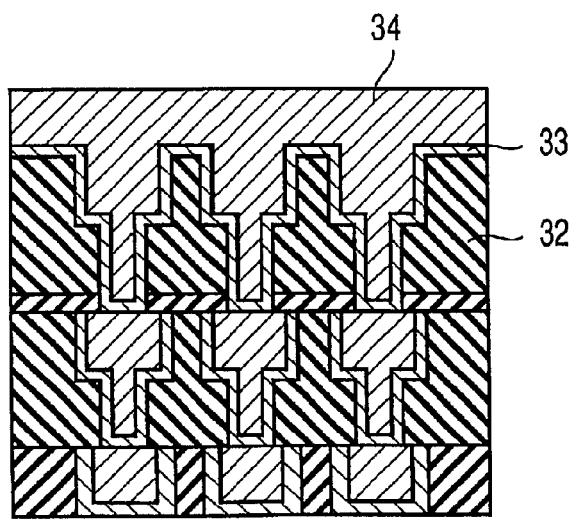

Next as shown in FIG. 2F, an intermediate layer 33 having a structure as described later is formed on the overall surface. Furthermore, an Al film 34 is formed on the intermediate layer 33 with the sputtering process (long throw sputtering or a reflow sputtering is preferable) or the like.

Figure 2G:
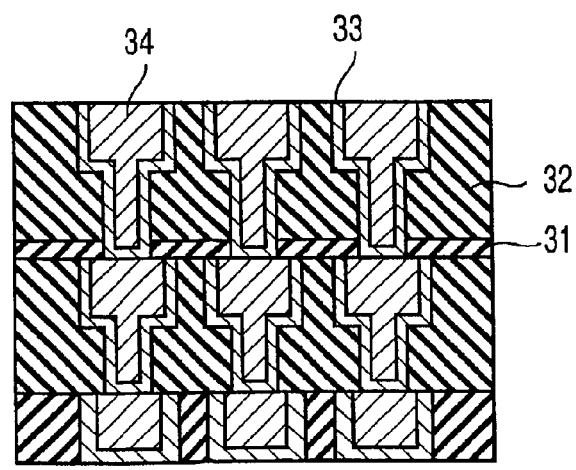

Furthermore, as shown in FIG. 2G, the planarization processing is carried out with the CMP process or the like to allow the intermediate layer 33 and the Al film 34 to be retained only in the via hole and the groove for the pad. With this processing, the via and the pad for the third layer region are formed. In this manner, an Al pad is obtained to which the bonding wire is connected.

Figure 3A:
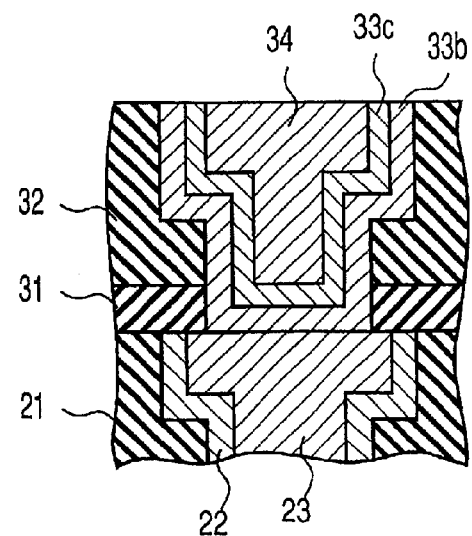
FIGS. 3A through 3C are sectional views showing a structure of a main portion of the semiconductor device according to the first embodiment of the present invention.
Figure 3B:
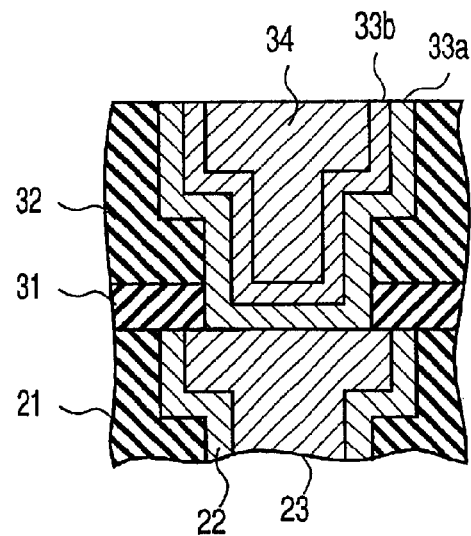
Figure 3C:
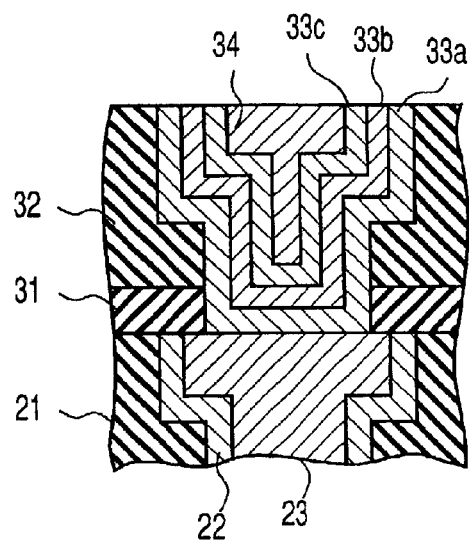

FIGS. 3A through 3C are views showing some examples of the structure of the above intermediate layer 33.

The structure of FIG. 3A is an example in which a lamination layer structure of a refractory metal nitride film 33b (for example, a barrier metal layer such as TaN film or the like), and a refractory metal film 33c (for example, Ta film or the like) are used as the intermediate layer 33. The conventional problem can be prevented by sandwiching the refractory metal film 33C between the Al film 34 and the refractory metal nitride film 33b. That is, the problem in that Al contained in the Al film 34 and N contained in the refractory metal nitride film 33b are allowed to react with each other to form AlNx which is an insulator can be prevented. Thus, the problem in that the resistance (particularly, via resistance) is raised with AlNx can be prevented.

The structure of FIG. 3B is an example in which a lamination layer structure of the refractory metal film 33a (for example, Ta film or the like) and the refractory metal nitride film 33b (for example, TaN film or the like) is used as the intermediate layer 33. With such a structure, the refractory metal film 33a having an excellent adhesiveness is sandwiched between the refractory metal nitride film 33b and the upper layer insulating film 32 (silicon oxide film type insulating film), so that the adhesiveness between the intermediate layer 33 and the upper layer insulating film 32 is improved. Consequently, it is possible to prevent the problem in that oxygen invades from a gap generated by adherence failure between the intermediate layer 33 and the upper layer insulating film 32 so that the Cu film 23 is oxidized.

The structure of FIG. 3C is an example in which a lamination structure of the refractory metal film 33a (for example, Ta film or the like) and the refractory metal nitride film 33b (for example, TaN film or the like) and the refractory metal film 33c (for example, Ta film or the like) are used as the intermediate layer 33, and both effects obtained in the structure of FIG. 3A and FIG. 3B can be obtained.

Incidentally, in the refractory metal films 33a and 33c, any of a Ta film, an Nb film, a Ti film, a W film, a V film can be used. In the refractory metal nitride film 33b, any one of a TaN film, an NbN film, a TiN film, a WN film or VN film can be used.

Furthermore, in each structure of FIGS. 3A through 3C, the refractory metal element contained in the refractory metal film and the refractory metal element contained in the refractory metal nitride film may be different from each other. However, it is preferable that the refractory metal element contained in the refractory metal film and the refractory metal element contained in the refractory metal nitride film are the same. In the structure of FIG. 3C, it is preferable that the refractory metals contained in the refractory metal film 33a, the refractory metal nitride film 33b and the refractory metal film 33c are the same. Since the same sputtering target can be used at the time of forming each film by sputtering through use of the same refractory metal element in this manner, an attempt can be made to shorten the manufacturing step and decrease the cost thereof.

Figure 4:
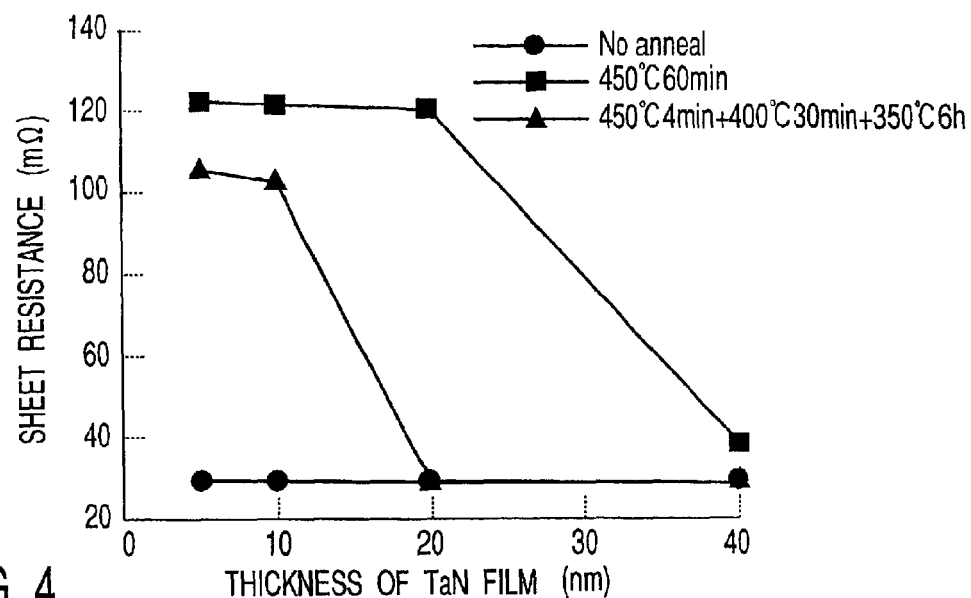
FIG. 4 is a view showing a relationship between a thickness of a TaN film and a sheet resistance.

Furthermore, the thickness of the refractory metal nitride film is preferably thick from the viewpoint of the barrier while the thickness may be preferably thin from the viewpoint of the resistance (in particular, the via resistance) and the CMP. FIG. 4 is a view showing a relationship between the thickness of the TaN film and the sheet resistance by changing the annealing condition. As can be seen from FIG. 4, under the EM examination condition of the Cu wiring (450° C. 4 min (reflow sputtering corresponding time)+400° C. 30 min (sinter corresponding time)+350° C. 6 h (EM examination corresponding time), it is preferable that the thickness of the TaN film is 20 nm or more. In consideration of heat stress (corresponding to an increase of EM examination time), it is preferable that the thickness of the TaN film is 40 nm or more. Furthermore, it is preferable that the thickness of Ta film is 5 nm or less because the CMP becomes difficult when the thickness is too thick.

Figure 5:
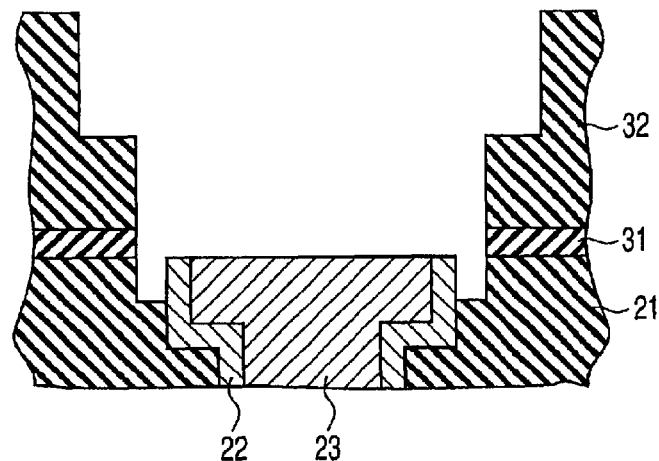
FIG. 5 is a view showing an unfavorable state in a connection between pads.

Furthermore, when a part of the via hole pattern formed in the upper layer insulating film 32 of the third layer region is located outside of the groove pattern for the pad formed in the second layer region, the following disadvantage as shown in FIG. 5 is generated. That is, when the upper layer insulating film 32 and the silicon nitride film 31 at step of FIG. 2E are over-etched, the interlayer insulating film 21 in the second layer region is also etched, so that a recess shown in FIG. 5 is generated. As a consequence, when the intermediate layer 33 and the Al film 34 are deposited at step of FIG. 2F, there is a problem that these films cannot be completely buried in the recess. Consequently, preferably the overall via hole pattern in the third layer region is located at the inside of the groove pattern for the pad in the second layer region.

Furthermore, it is preferable that the Al pad has a divided pad structure. By using the divided pad structure, decrease in the adhesiveness resulting from a difference in the expansion coefficient between the barrier metal or the like and the silicon oxide film type insulating film can be alleviated.

Figure 6:
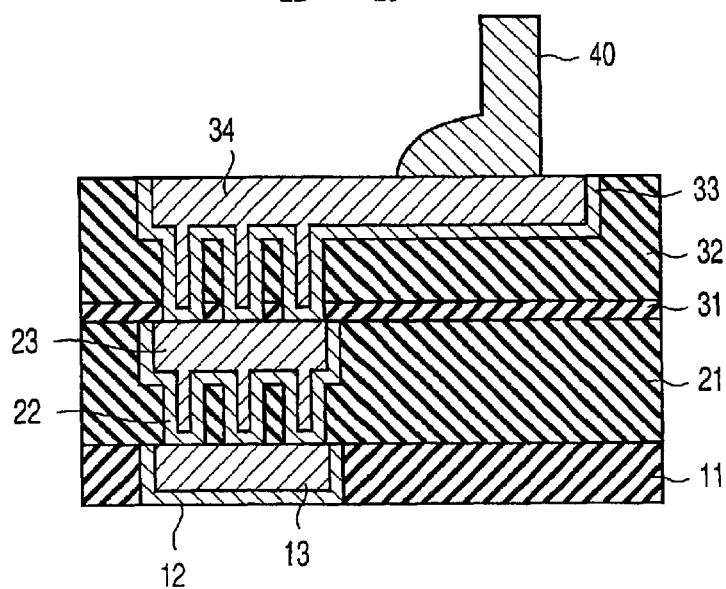
FIG. 6 is a sectional view showing a structure for improving endurance at the time of wire bonding in the embodiments of the present invention.

FIG. 6 is a view showing a structure for improving the endurance at the time of wire bonding. That is, a pad portion comprising the Al film 34 and the intermediate layer 33 is extended, so that a bonding wire 40 is connected to the extended region. With such a structure, even when the intermediate layer 33 is penetrated and torn by a bonding wire at the wire bonding, the influence upon the connection portion between the Cu film 23 and the Al film 34 can be suppressed.

(Second Embodiment)

Figure 7A:
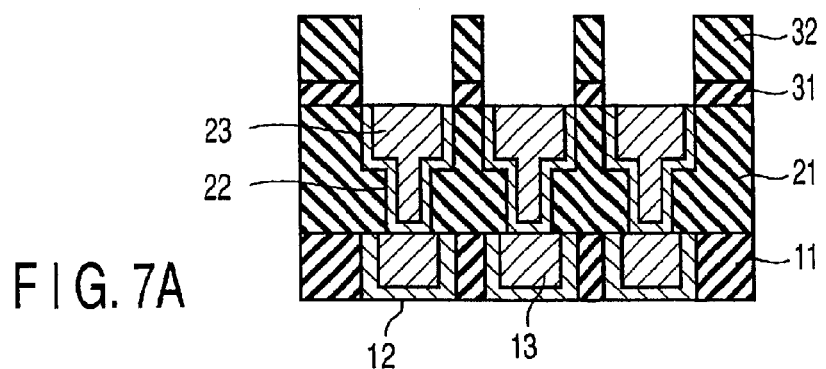
FIGS. 7A through 7C are sectional views showing a method for manufacturing the semiconductor device according to the second embodiment of the present invention.
Figure 7B:
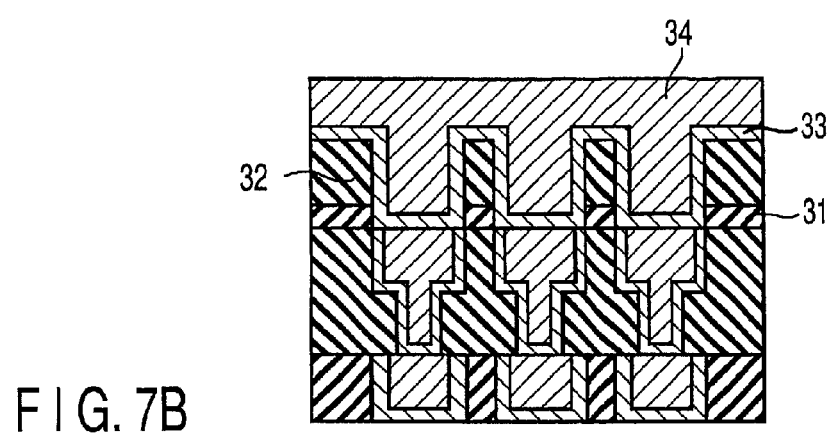
Figure 7C:
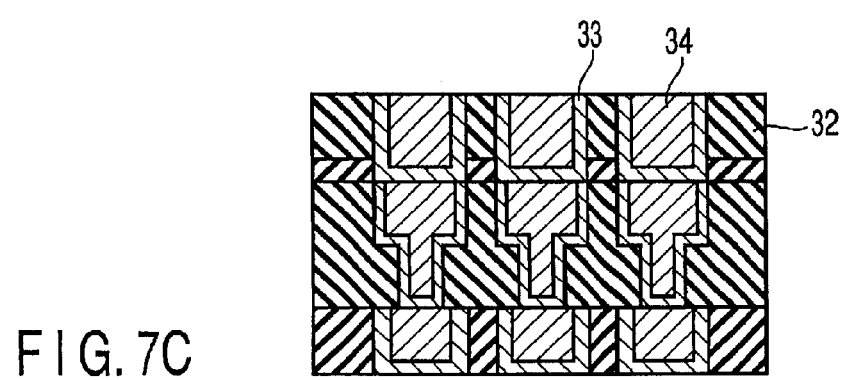

FIGS. 7A through 7C are sectional views showing a method for manufacturing a semiconductor device according to the second embodiment of the present invention. The second embodiment is an example in which a single damascene process is used in the formation of the Al pad of the third layer region. Up to the midst step (FIG. 2D), the second embodiment is the same as the first embodiment, so that the step after that will be explained.

After the step shown in FIG. 2D, as shown in FIG. 7A, in the same manner as the first embodiment, the silicon nitride film (plasma SiN film) 31 is formed. Then, the upper layer insulating film 32 (for example, TEOS-SiO$_2$ film or Low-k (low dielectric constant) film, or a lamination structure thereof) are formed on the silicon nitride film 31. Thereafter, the silicon nitride film 31 and the upper layer insulating film 32 are processed to form a groove for the pad.

Next, as shown in FIG. 7B, the intermediate layer 33 is formed on an overall surface. Furthermore, the Al film 34 is formed on the intermediate layer 33 with the sputtering process (long throw sputtering or the reflow sputtering is preferable) or the like. With respect to the intermediate layer 33, the second embodiment is the same as the first embodiment. That is, the structure of the intermediate layer 33 is a lamination layer structure shown in FIG. 3A through 3C, specifically, a lamination layer structure of the refractory metal film/refractory metal nitride film, a lamination layer of the refractory metal nitride film/refractory metal film, or a lamination structure of the refractory metal film/refractory metal nitride film/refractory metal film. Furthermore, with respect to the material used in the refractory metal film and the refractory metal nitride film and a combination thereof, the second embodiment is the same as the first embodiment.

Next, as shown in FIG. 7C, a pad of the third region is formed by carrying out the planarization processing with the CMP process to allow the intermediate layer 33 and the Al film 34 to be retained in the groove for the pad.

Figure 7D:
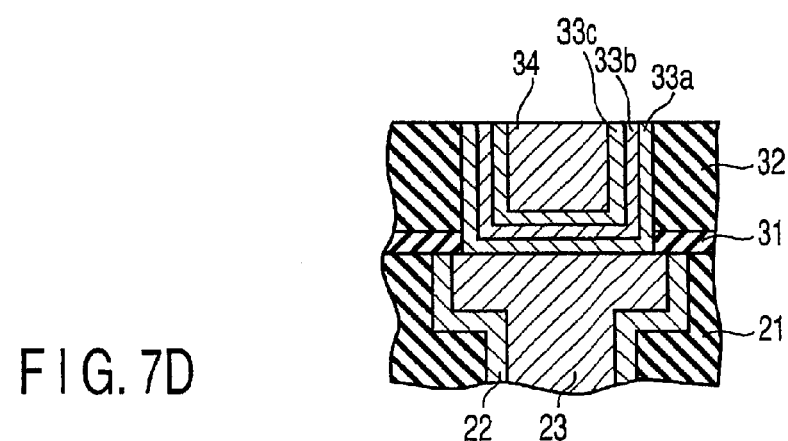
FIG. 7D is a sectional view showing an essential portion of the structure corresponding to FIG. 7C.

FIG. 7D is a sectional view showing an essential portion of a structure corresponding to FIG. 7C. When a part of the groove pattern for the pad formed in the upper layer insulating film 32 of the third layer region is located outside of the groove pattern for the pad formed in the second layer region, the disadvantage described in the similar manner as described in the first embodiment is generated. Consequently, as described in FIG. 7D, preferably the whole groove pattern for the pad in the third layer region is located inside of the groove pattern for the pad in the second layer region.

(Third Embodiment)

Figure 8A:
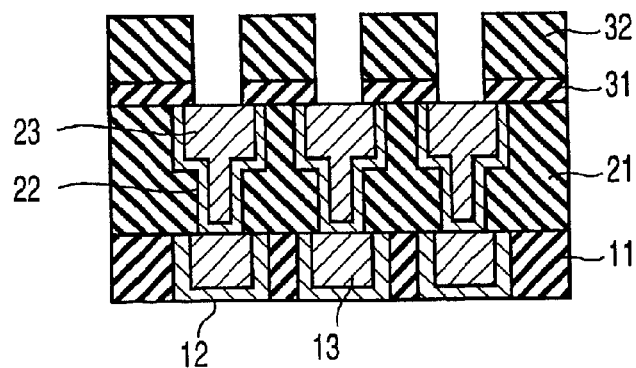
FIGS. 8A through 8C are sectional views showing a method for manufacturing the semiconductor device according to a third embodiment of the present invention.
Figure 8B:
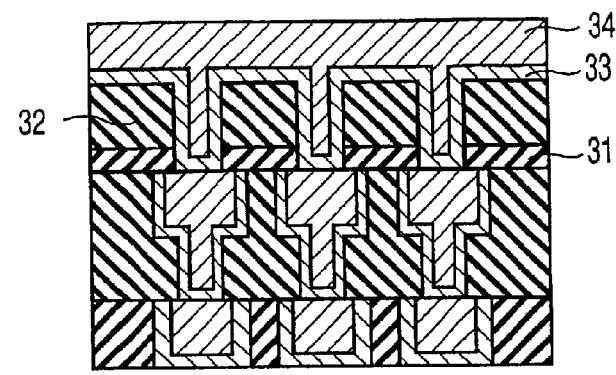
Figure 8C:
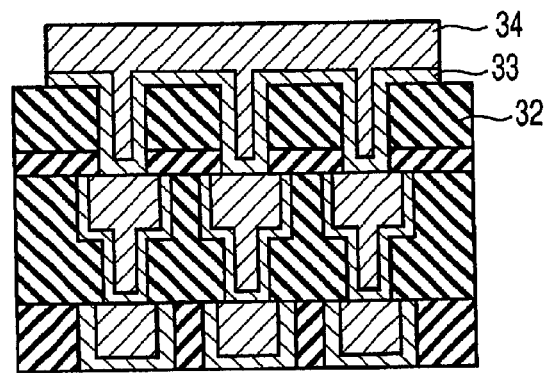

FIGS. 8A through 8C are sectional views showing a method for manufacturing a semiconductor device according to a third embodiment of the present invention. The third embodiment is an example in which the via process and the RIE (reactive ion etching) process are used in the formation of the Al pad of the third layer region. Since the third embodiment is the same as the first embodiment up to the midst step (FIG. 2D), the step after that will be explained.

After the step shown in FIG. 2D, as shown in FIG. 8A, the silicon nitride film (plasma SiN film) 31 is formed on an overall surface in the similar manner as described in the first embodiment. Then, the upper layer insulating film 32 (for example, TEOS-SiO$_2$ film or the Low-k film (low dielectric constant) film, or the lamination layer structure thereof) is formed on the silicon nitride film 31. Thereafter, the silicon nitride film 31 and the upper layer insulating film 32 are processed to form a via hole.

Next, as shown in FIG. 8B, the intermediate layer 33 is formed on an overall surface. Furthermore, an Al film 34 is formed on the intermediate layer 33 with the sputtering process (either long throw sputtering or reflow sputtering is preferable) or the like. With respect to the intermediate layer 33, the third embodiment is the same as the first embodiment. That is, the structure of the intermediate layer 33 is a lamination structure shown in FIGS. 3A through 3C, specifically, a lamination structure of the refractory metal film/refractory metal nitride film, a lamination structure of the refractory metal nitride film/refractory metal film, or a lamination structure of the refractory metal film/refractory metal nitride film/refractory metal film. Furthermore, with respect to the material used in the refractory metal film and the refractory metal nitride film, and a combination thereof, the second embodiment is the same as the first embodiment.

Next, as shown in FIG. 7C, a resist mask (not shown) is used to etch the Al film 34 and the intermediate layer 33 to form a pad of a third region.

Figure 8D:
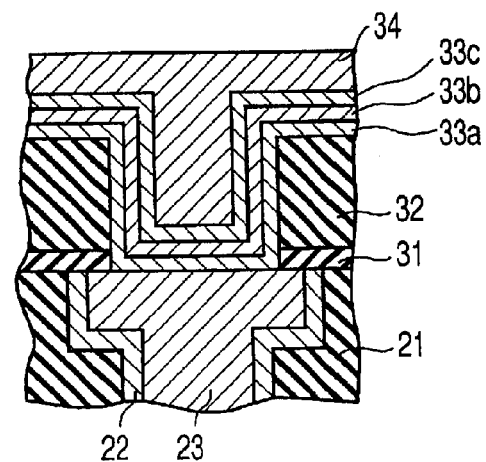
FIG. 8D is a sectional view showing an essential portion of the structure corresponding to FIG. 8C.

FIG. 8D is a sectional view showing an essential portion of a structure corresponding to FIG. 8C. When a part of the via hole pattern formed in the upper layer insulating film 32 of the third layer region is located outside of the groove pattern for the pad formed in the second layer region, the disadvantage described in the similar manner as described in the first embodiment is generated. Consequently, as described in FIG. 8D, preferably the whole via hole pattern in the third layer region is located inside of the groove pattern for the pad in the second layer region.

(Fourth Embodiment)

Figure 9A:
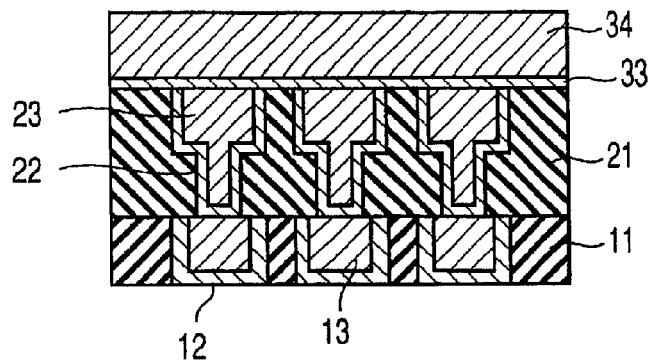
FIGS. 9A and 9B are sectional views showing a method for manufacturing the semiconductor device according to a fourth embodiment of the present invention.
Figure 9B:
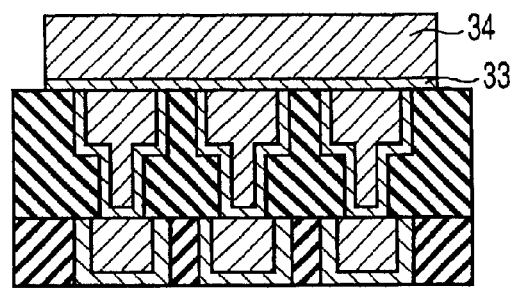
Figure 9C:
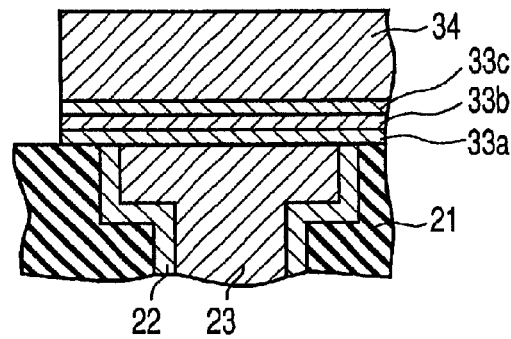
FIG. 9C is a sectional view showing an essential portion of the structure corresponding to FIG. 9B.
Figure 10:
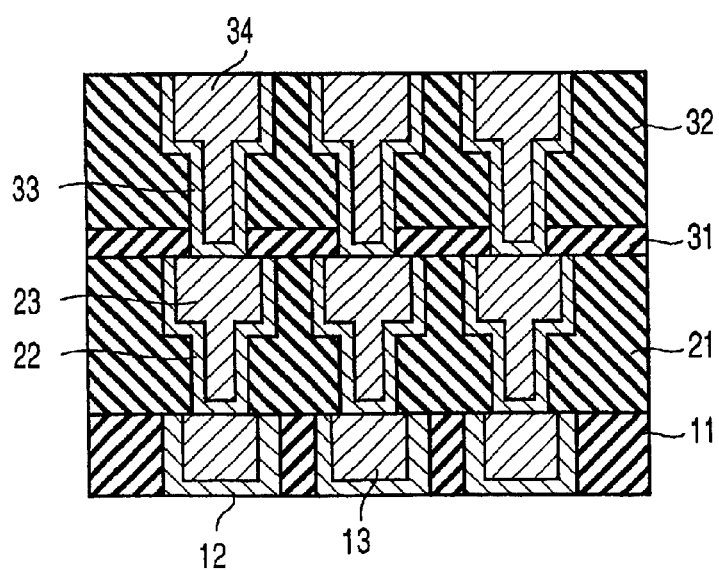
FIG. 10 is a sectional view showing a structure of a semiconductor device according to the prior art.

FIGS. 9A through 9C are sectional views showing a method for manufacturing a semiconductor device according to the fourth embodiment of the present invention. The fourth embodiment is an example in which RIE process is used in the formation of the Al pad of the third layer region. Up to the midst step (FIG. 2D), the fourth embodiment is the same as the first embodiment, so that the step after that will be explained.

After the step shown in FIG. 2D, as shown in FIG. 9A, the intermediate layer 33 is formed on an overall surface. Furthermore, the Al film 34 is formed on the intermediate layer 33 with the sputtering process (long throw sputtering or the reflow sputtering is preferable) or the like. With respect to the intermediate layer 33, the fourth embodiment is the same as the first embodiment. That is, the structure of the intermediate layer 33 is a lamination layer structure shown in FIGS. 3A through 3C, specifically, a lamination layer structure of the refractory metal film/refractory metal nitride film, a lamination layer of the refractory metal nitride film/refractory metal film, or a lamination structure of the refractory metal film/refractory metal nitride film/refractory metal film. Furthermore, with respect to the material used in the refractory metal film and the refractory metal nitride film, and a combination thereof, the fourth embodiment is the same as the first embodiment.

Next, as shown in FIG. 9B, a pad of the third region is formed by etching the Al film 34 and the intermediate layer 33 by using a resist mask (not shown).

FIG. 9C is a sectional view showing an essential portion of a structure corresponding to FIG. 9B. Unless the pattern of the Cu pad formed in the second layer region is covered with the Al pad pattern of the third layer region, there arises a disadvantage in that the Cu pad formed in the second layer region is oxidized. Consequently, as shown in FIG. 9C, it is preferable that the pad pattern in the third layer region covers the whole pad pattern in the second layer region, that is the whole pad pattern in the second layer region is located inside of the pad pattern in the third layer region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a Cu film provided above a main surface of a semiconductor substrate and used as a wiring;
   an intermediate layer formed at least on the Cu film, the intermediate layer comprising a TaN film formed on the Cu film and a Ta film formed on the TaN film;
   an Al film formed on the Ta film and used as a pad, the Al film having a horizontally extending portion under which the Cu film is not formed; and
   a conductive connection member connected to the Al film only at the horizontally extending portion.

2. The semiconductor device according to claim 1, wherein the intermediate layer has a first portion which contacts the Cu film and a second portion which does not contact the Cu film, and an insulating film contacts the second portion.

3. The semiconductor device according to claim 1, wherein the intermediate layer has a portion corresponding to the extending portion.

4. The semiconductor device according to claim 1, wherein the conductive connection member includes a bonding wire.

5. The semiconductor device according to claim 1, wherein a thickness of the Ta film is 5 nm or less.

6. The semiconductor device according to claim 1, wherein a thickness of the TaN film is 20 nm or more.

7. The semiconductor device according to claim 1, wherein a thickness of the TaN film is 40 nm or more.

8. The semiconductor device according to claim 1, wherein no conductive connection member is connected to that portion of the Al film under which the Cu film is formed.

9. The semiconductor device according to claim 1, wherein the Al film has a plurality of vertically extending portions extending toward the Cu film, and wherein the intermediate layer has a plurality of portions provided between the vertically extending portions and the Cu film.

10. The semiconductor device according to claim 9, further comprising an insulating film surrounding each of the vertically extending portions.

* * * * *